(12) United States Patent
Hurrell et al.

(10) Patent No.: US 10,541,604 B2
(45) Date of Patent: Jan. 21, 2020

(54) BIAS CURRENT SUPPLY TECHNIQUES

(71) Applicant: Analog Devices Global Unlimited Company, Hamilton (BM)

(72) Inventors: Christopher Peter Hurrell, Cookham (GB); Derek J. Hummerston, Hungerford (GB)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/986,346

(22) Filed: May 22, 2018

(65) Prior Publication Data

US 2019/0363630 A1    Nov. 28, 2019

(51) Int. Cl.
*H03F 3/45* (2006.01)
*H02M 3/07* (2006.01)

(52) U.S. Cl.
CPC .......... *H02M 3/07* (2013.01); *H03F 3/45475* (2013.01); *H03F 2200/27* (2013.01); *H03F 2203/45112* (2013.01)

(58) Field of Classification Search
USPC .......................................... 330/252–261, 283
See application file for complete search history.

(56) References Cited

U.S. PATENT DOCUMENTS 5,212,456 A    5/1993  Kovalcik
2008/0272833 A1*  11/2008  Ivanov .................... H02M 3/07
                                                            327/536

* cited by examiner

*Primary Examiner* — Hieu P Nguyen
(74) *Attorney, Agent, or Firm* — Schwegman Lundberg & Woessner, P.A.

(57) ABSTRACT

Techniques for supplying a bias current to a load are provided. In certain examples, a circuit can include a level-shift capacitance, a current source, and a load configured to receive a bias current in a first state of the circuit. The current source and the level-shift capacitance can be coupled in series between the load and a supply voltage in the first state. In some examples, during a second state of the circuit, the level-shift capacitance can receive charge, and can be isolated from one of the load or the current source.

20 Claims, 5 Drawing Sheets

BIAS CURRENT SUPPLY TECHNIQUES

FIELD OF THE DISCLOSURE

This document pertains generally, but not by way of limitation, to bias circuits, and more particularly, to bias current supply techniques.

BACKGROUND

Various loads can use a bias current to provide a desired function. Amplifiers, including differential amplifiers, are just one example of such loads and can often use a tail current device to supply input devices of the amplifier. However, if the voltage at the input of the amplifier gets too close to the supply voltage provided to the amplifier, components of the tail current device can get squeezed such that there is insufficient head room voltage to allow the tail current device to operate. In such cases, the amplifier, or other load, can fail to provide a valid output signal. Previous solutions can employ a conventional charge pump that supplies current from a boosted voltage that can stress low voltage components of the load.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
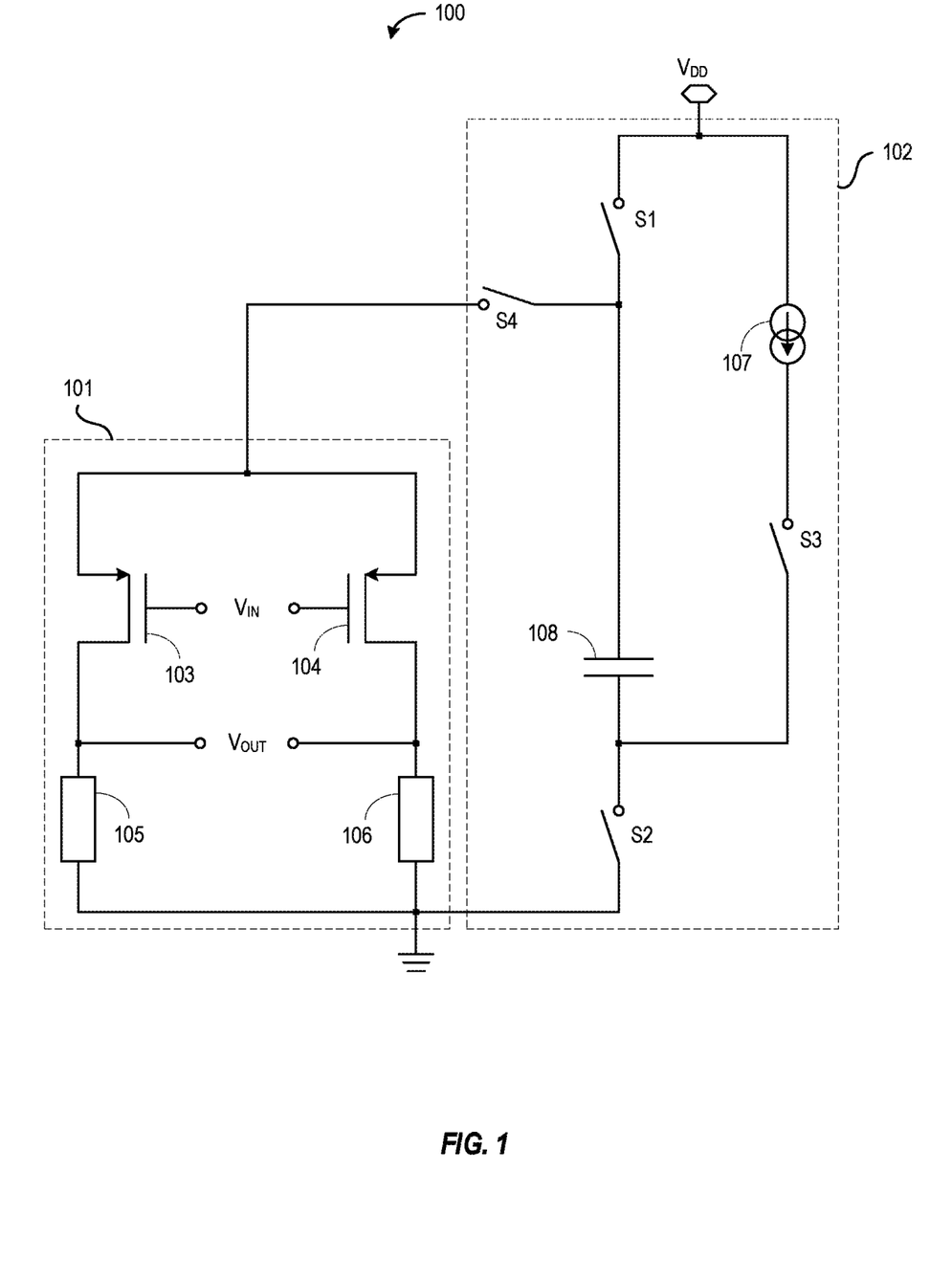
FIG. 1 illustrates generally an example amplifier circuit according to the present subject matter.

FIG. 1 illustrates generally an example amplifier circuit 100 according to the present subject matter. The circuit can include an amplifier 101 and a supply circuit 102. The amplifier 101 can receive a differential input signal ($V_{IN}$) and provide an amplified version ($V_{OUT}$) of the differential signal at differential outputs of the amplifier 101. In certain examples, the amplifier 101 can include first and second input transistors 103, 104. Each input transistor 103, 104 can receive the differential input signal ($V_{IN}$) at a control node. A first switched-node of each transistor 103, 104, such as the source of a p-channel transistor, can be coupled to an output of the supply circuit 102. A second switched-node of each transistor 103, 104, such as the drain of a p-channel transistor, can couple to an impedance, such as a resistor 105, 106, and can provide an output terminal to provide the amplified signal ($V_{OUT}$) of the amplifier circuit 100. It is understood that other types of transistors can be used to form the amplifier 101 without departing from the scope of the present subject matter.

The supply circuit 102 can receive a supply voltage ($V_{DD}$) and can provide supply current to the amplifier 101. In certain examples, the supply circuit 102 can include a current source 107 coupled to the supply voltage ($V_{DD}$), a level-shift capacitor 108, and a plurality of switch contacts (S1, S2, S3, S4). The switch contacts (Sn) can selectively couple the level-shift capacitor 108 to the supply voltage ($V_{DD}$) in a first state and to the amplifier 101 in a second state. The particular arrangement of the level-shift capacitor 108 in the second state, as further discussed below, can provide operational current for the amplifier 101 via the charge on the level-shift capacitor 108 but also from the supply voltage via the current source 107. With such a configuration, the amplifier 101 can provide a valid amplified signal ($V_{OUT}$) representative of the input signal ($V_{IN}$) even when voltage of the input signal ($V_{IN}$) approaches the voltage level of the supply voltage ($V_{DD}$). The level-shift capacitor 108 is shown as a single capacitor and in various examples is just that. However, level-shift capacitor 108 can signify a single capacitance value, or single capacitance network, that can be illustrated as a single, constant capacitance during both the first state and the second state but can be made up of multiple capacitors. It is understood that supplying a bias current for a differential amplifier is one example application for the supply circuit 102 and that other applications are possible without departing from the scope of the present subject matter. Such applications can include but are not limited to, supplying a bias current to a strain gauge, such as a resistive strain gauge, an audio circuit such as an audio amplifier or microphone circuit, etc.

Figure 2A:
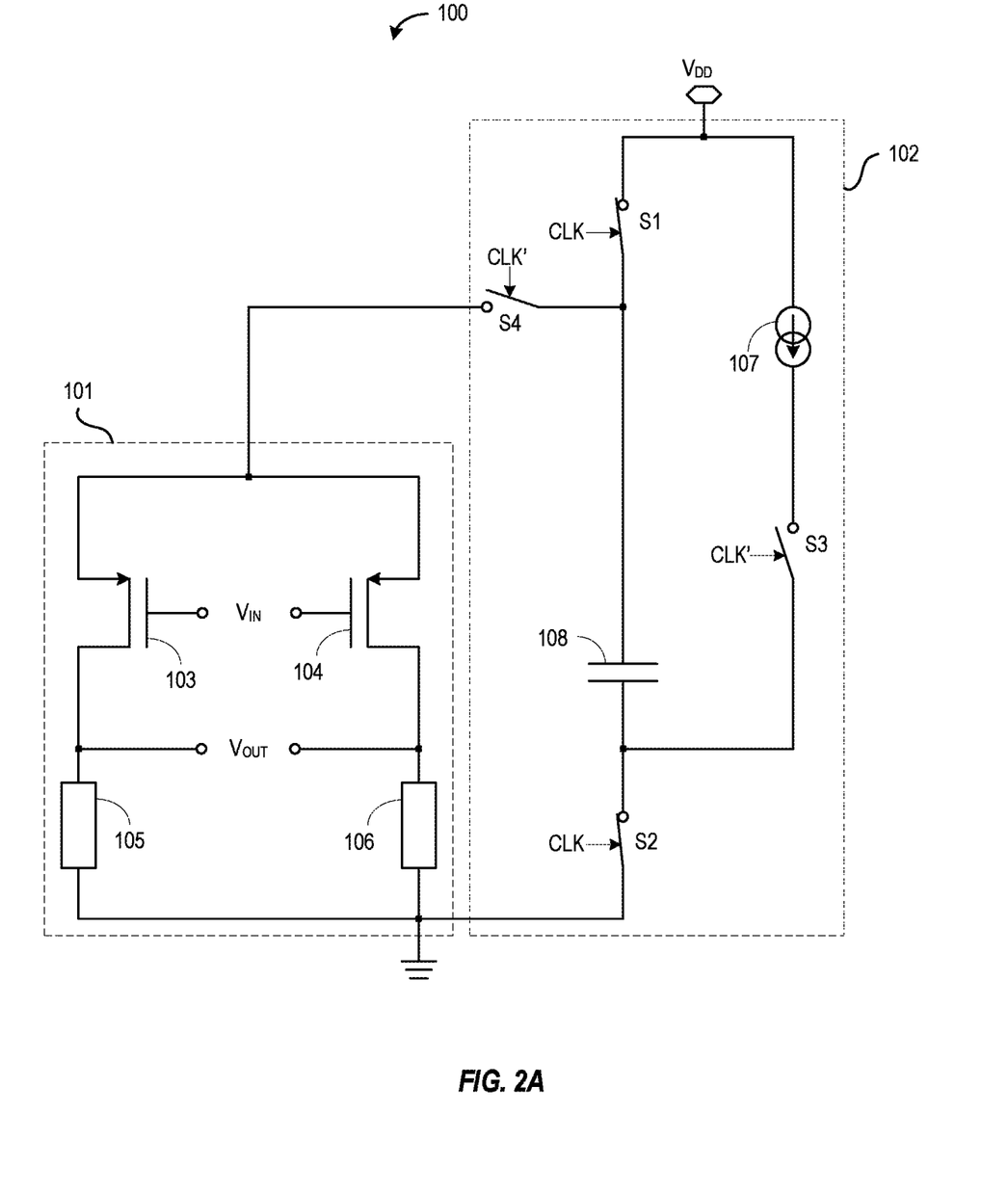
FIG. 2A illustrates the example amplifier circuit of FIG. 1 during a first, charge state.

FIG. 2A illustrates the example amplifier circuit of FIG. 1 during a first charge state. During the first state, a charge state, a first switch contact (S1) and a second switch contact (S2) can be closed. A third switch contact (S3) and a fourth switch contact (S4) can be open. The first switch contact (S1) can couple a first node of the level-shift capacitor 108 to the supply voltage (VDD). The second switch contact (S2) can couple the other node of the level-shift capacitor 108 to ground. The closed nature of the first and second switch contacts (S1, S2), as well as the open nature of the third and fourth switch contacts (S3, S4), can allow the level-shift capacitor 108 to store charge from the supply voltage (VDD). Without a second supply circuit, the amplifier 101 typically does not provide a valid amplified output when the amplifier circuit 100 is in the charge state. It is understood that the level-shift capacitor 108 can be charged using means other than directly coupling to the supply voltage (VDD) without departing from the scope of the present subject matter. For example, an additional current source or inductor in combination with other switches can provide an alternative arrangement to charge the level-shift capacitor during the first, charge state.

Figure 2B:
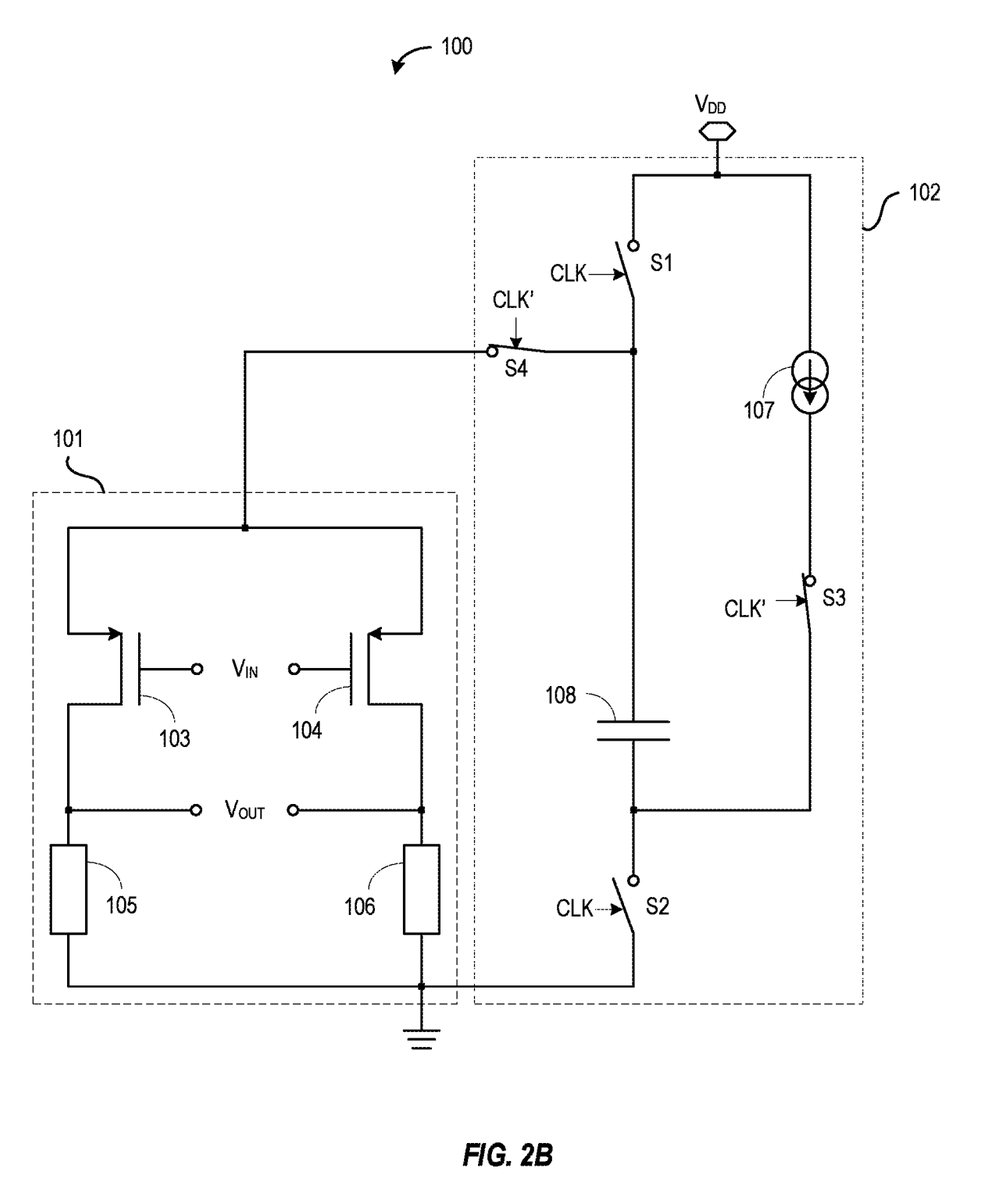
FIG. 2B illustrates the example amplifier circuit of FIG. 1 during a second, sample state.

FIG. 2B illustrates the example amplifier circuit of FIG. 1 during a second sample state. During the second state, a sampling state, the first switch contact (S1) and the second switch contact (S2) can be open. The third switch contact (S3) and a fourth switch contact (S4) can be closed. The first switch contact (S1) can isolate the first node of the capacitor from the supply voltage (VDD). The second switch contact can isolate the other node of the capacitor from ground. The third switch contact (S3) can couple the second node of the capacitor to the current source 107. In some examples, the current source 107 can be coupled to the supply voltage (VDD) but is not so limited. The fourth switch contact can couple the first node of the capacitor to the amplifier 101. The open nature of the first and second switch contacts (S1, S2), as well as, the closed nature of the third and fourth switch contacts (S3, S4), can allow the capacitor and the current source to supply current to input transistors 103, 104 of the amplifier 101 at a voltage that allows the input transistors to pass sufficient current even when the input voltages are near or at the supply voltage (VDD). Unlike conventional charge pump applications, the floating nature of the second node of the level-shift capacitor 108 can allow the characteristics of the load, or input amplifiers in this example, to determine the voltage at the supply input to the load 101. As such, the voltage supplied to the amplifier 101 by the level-shift capacitor 108 and current source 107 can be just about the common mode voltage at input of the amplifier 101 plus the gate-to-source voltage of the input transistors 103, 104.

Such arrangement can allow current to be sourced from both the charge stored on the capacitor and the current source until the capacitor substantially discharges. Compared to other charge pump type supplies, which can provide a higher supply voltage to the amplifier, the present subject matter, in certain examples, can provide a longer sampling state of the amplifier for an equivalently sized capacitor.

In certain examples, if the voltages of the input to the amplifiers is not near the supply voltage VDD, the amplifier can continue to operate and provide a valid output even after the capacitor substantially discharges. If the voltages of the input signal to the amplifiers is near the supply voltage (VDD) when the capacitor substantially discharge, the amplifier will cease to provide a valid output as the input transistors can be "squeezed", or turned off, as the potential between the supply node of the amplifier and the control nodes of the input transistors is insufficient to allow current flow through the input transistors.

In some examples, the output of the amplifier circuit 101 can provide an input signal to an analog-to-digital converter (ADC). In certain examples, the switch contacts can be transistors and a clocking circuit can control the switches. In certain examples, each clock signal (CLK, CLK') can be an inverted representation of the other clock signal. In some examples, the clock signals can be binary and can be configured to not overlap one of the two states. For example, in certain examples of non-overlapping clock signals, the clocking circuit can allow the switch contacts to all be open for a short interval between the two states of the amplifier circuit, but not allow all the switch contacts to be closed at the same time, or vice versa.

Figure 3:
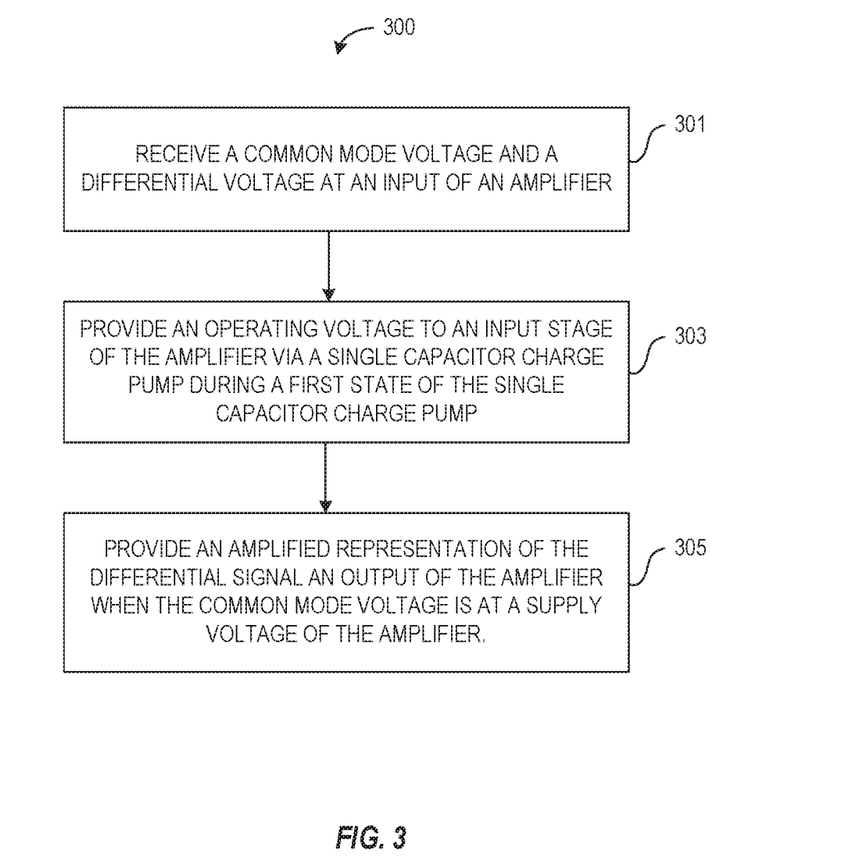
FIG. 3 illustrates generally a flowchart of an example method of operating an amplifier according to various examples of the present subject matter.

FIG. 3 illustrates generally a flowchart of an example method 300 of operating an amplifier according to various examples of the present subject matter. At 301, an input signal having a common mode voltage and a differential mode voltage can be received at the amplifier. In various examples, a supply circuit of the amplifier can receive supply power at a supply voltage. The supply circuit can include a current source and a level-shift capacitor or level shift capacitor network. At 303, the supply circuit can supply an operating voltage to an input stage of the amplifier via the single capacitance network charge pump during a first state of the amplifier. In various examples, the level shift capacitor can be selectively coupled to the current source, to supply an operating voltage to the amplifier during the first state. With the operating voltage present at the input stage of the amplifier, at 305, an amplified representation of the differential mode voltage of the input signal can be provided at an output of the amplifier. Even if the common mode voltage of the input signal approaches the supply voltage, the operating voltage, and corresponding operating current of the amplifier, via the arrangement of the single capacitance network and current source as shown in FIGS. 1, 2A, and 2B, can be maintained at a level sufficient to provide the amplified representation of the input signal during the interval of the first state.

In certain examples, the first state can correspond to a sampling state of an analog-to-digital converter (ADC). During a second state of the amplifier, the single capacitance network can be charged by connecting the nodes of the network between the supply voltage and ground. The second state, or charge state, can correspond to a conversion state of the ADC. Conventional techniques can also use a single capacitance network, however, such techniques typically provide an operating voltage by stacking the voltage across the capacitance on top of the supply voltage and can be 1.5 times the supply voltage or higher. Such voltages can add stress to the load such as the transistors of the input stage of the amplifier. The present subject matter, via the arrangement of the single capacitance network and the current source during the first state, provides an operating voltage that is determined by the common mode voltage and the gate-to-source voltage of an input transistor of the amplifier. In addition, the present subject matter can provide current from both the charge stored on the single capacitance network during the charge state, as well as, charge from the supply voltage via the current source. Such an arrangement can provide a very steady operating voltage during the sampling state of around 1.1 to 1.3 times the supply voltage.

Figure 4:
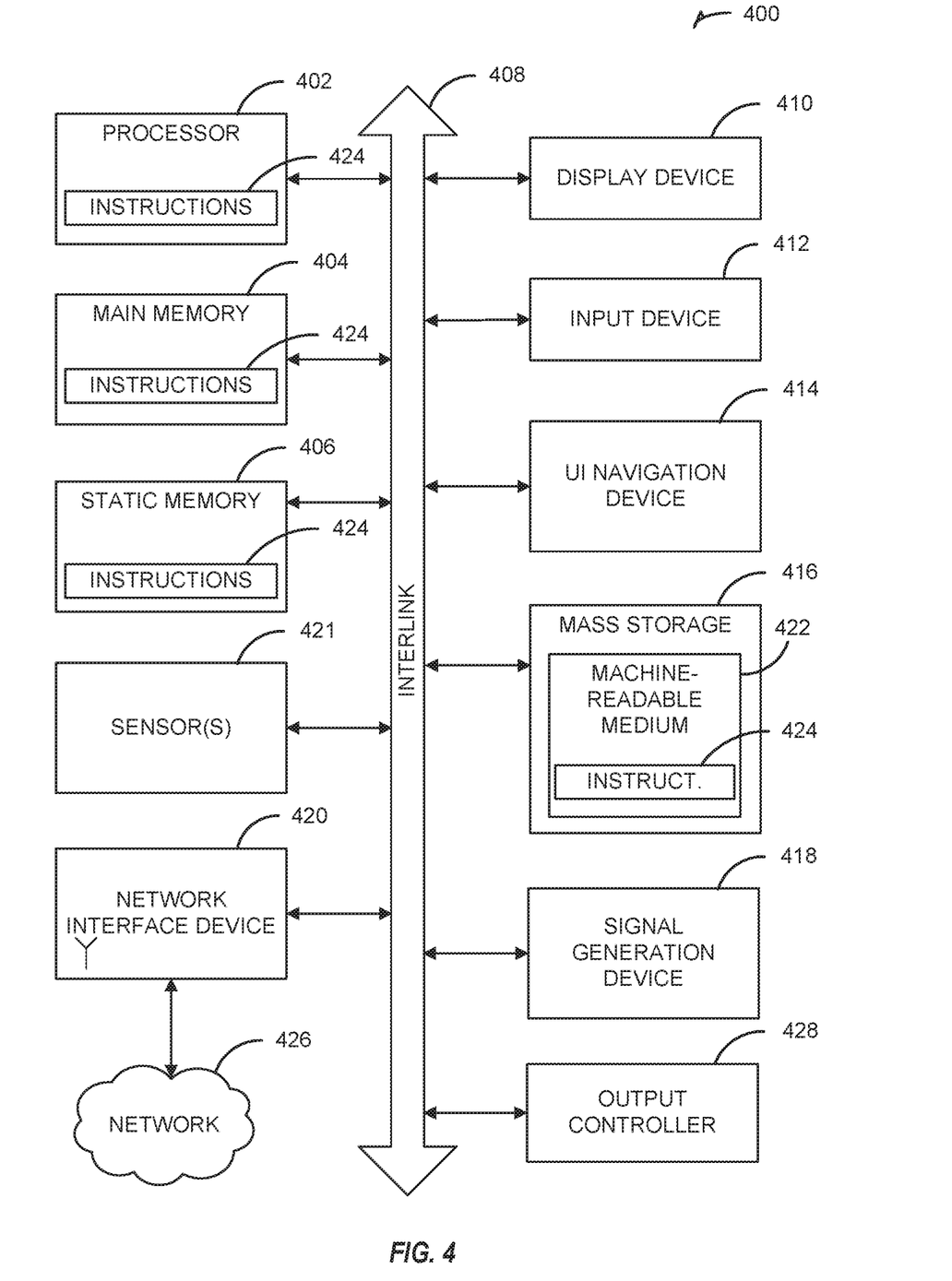
FIG. 4 illustrates a block diagram of an example machine upon which any one or more of the techniques (e.g., methodologies) discussed herein may perform.

FIG. 4 illustrates a block diagram of an example machine 400 upon which any one or more of the techniques (e.g., methodologies) discussed herein may perform. In alternative embodiments, the machine 400 may operate as a standalone device or may be connected (e.g., networked) to other machines. In a networked deployment, the machine 400 may operate in the capacity of a server machine, a client machine, or both in server-client network environments. In an example, the machine 400 may act as a peer machine in peer-to-peer (or other distributed) network environment. As used herein, peer-to-peer refers to a data link directly between two devices (e.g., it is not a hub-and spoke topology). Accordingly, peer-to-peer networking is networking to a set of machines using peer-to-peer data links. The machine 400 may be a single-board computer, an integrated circuit package, a system-on-a-chip (SOC), a personal computer (PC), a tablet PC, a set-top box (STB), a personal digital assistant (PDA), a mobile telephone, a web appliance, a network router, or other machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

Machine (e.g., computer system) 400 may include a hardware processor 402 (e.g., a central processing unit (CPU), a graphics processing unit (GPU), a hardware processor core, or any combination thereof), a main memory 404 and a static memory 406, some or all of which may communicate with each other via an interlink (e.g., bus) 408. The machine 400 may further include a display unit 410, an alphanumeric input device 412 (e.g., a keyboard), and a user interface (UI) navigation device 414 (e.g., a mouse). In an example, the display unit 410, input device 412 and UI navigation device 414 may be a touch screen display. The machine 400 may additionally include a storage device (e.g., drive unit) 416, a signal generation device 418 (e.g., a speaker), a network interface device 420, and one or more sensors 421, such as a global positioning system (GPS) sensor, compass, accelerometer, or other sensor. The machine 400 may include an output controller 428, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 416 may include a machine readable medium 422 on which is stored one or more sets of data structures or instructions 424 (e.g., software) embodying or utilized by any one or more of the techniques or functions described herein. The instructions 424 may also reside, completely or at least partially, within the main memory 404, within static memory 406, or within the hardware processor 402 during execution thereof by the machine 400. In an example, one or any combination of the hardware processor 402, the main memory 404, the static memory 406, or the storage device 416 may constitute machine readable media.

While the machine readable medium 422 is illustrated as a single medium, the term "machine readable medium" may include a single medium or multiple media (e.g., a centralized or distributed database, and/or associated caches and servers) configured to store the one or more instructions 424.

The term "machine readable medium" may include any medium that is capable of storing, encoding, or carrying instructions for execution by the machine 400 and that cause the machine 400 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 424 may further be transmitted or received over a communications network 426 using a transmission medium via the network interface device 420 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 420 may include one or more physical jacks (e.g., Ethernet, coaxial, or phone jacks) or one or more antennas to connect to the communications network 426. In an example, the network interface device 420 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 400, and includes digital or analog communications signals or other intangible medium to facilitate communication of such software.

VARIOUS NOTES & EXAMPLES

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A circuit comprising:
    a transistor load; and
    a supply circuit configured to receive a supply voltage and to supply an operating current to the transistor load during a first state of the circuit and to charge a level-shift capacitor during a second state of the circuit, the supply circuit comprising:
        the level-shift capacitor; and
        a current source;
    wherein the level-shift capacitor is coupled in series with the current source to supply the operating current to the transistor load during the first state; and
    wherein the level-shift capacitor is isolated from the current source during the second state.

2. The circuit of claim 1, including means for charging the level-shift capacitor in the second state of the circuit.

3. The circuit of claim 2, wherein the level-shift capacitor includes a first node and a second node; and
    wherein, in the second state, the first node is coupled to the supply voltage and the second node is coupled to ground.

4. The circuit of claim 3, wherein, in the first state, the first node is coupled to the transistor load, and the second node is coupled to the current source.

5. The circuit of claim 4, including a first switch, configured to couple the first node with the supply voltage in the second state and to isolate the first node from the supply voltage in the first state.

6. The circuit of claim 5, including a second switch, configured to couple the second node with ground in the second state and to isolate the second node from ground in the first state.

7. The circuit of claim 4, including a first switch, configured to isolate the first node from the transistor load in the second state and to couple the first node with the transistor load in the first state.

8. The circuit of claim 7, including a second switch, configured to isolate the second node from the current source in the second state and to couple the second node with the current source in the first state.

9. The circuit of claim 1, wherein the supply circuit is configured to maintain the operating current when a common mode voltage of an input signal of the transistor load is at a level of the supply voltage.

10. A method of providing a bias current to a load, the method comprising:
    isolating a level-shift capacitor of a supply circuit from a current source of the supply circuit during a first state of the supply circuit;
    charging the level-shift capacitor during the first state of the supply circuit;
    coupling the level shift capacitor and a current source together in series to provide a series-connect level-shift capacitor and current source; and
    coupling the series-connected level-shift capacitor and current source to a bias input of the load to supply the bias current to the load during a second state of the supply circuit.

11. The method of claim 10, isolating the level-shift capacitor from the load prior to charging the level-shift capacitor.

12. The method of claim 10, wherein the coupling the level-shift capacitor and a current source together in series includes allowing a voltage at a node connecting the level-shift capacitor to the current source to float during the second state.

13. The method of claim 12, wherein charging the level-shift capacitor includes receiving charge at the level-shift capacitor from an inductor of the supply circuit.

14. The method of claim 10, wherein charging the level-shift capacitor includes:
    receiving a supply voltage at the supply circuit;
    coupling a first node of the level-shift capacitance to the supply voltage; and
    coupling a second node of the level-shift capacitance to ground.

15. The method of claim 10, wherein the load includes an amplifier having a transistor input stage; and
    wherein coupling the series-connected level-shift capacitor and current source to a bias input of the load includes:
        coupling a first node of the level-shift capacitance to the transistor input stage;
        isolating the first node of the level-shift capacitor from a charge source; and coupling a second node of the level-shift capacitor to a supply voltage via the current source.

16. The method of claim 15, including maintaining the bias current to the transistor input stage when a common mode voltage received at an input of the transistor input stage is at or above a level of the supply voltage.

17. A circuit comprising:
a load configured to receive a bias current in a first state of the circuit;
a level-shift capacitance; and
a current source;
wherein the current source and the capacitance are coupled in series between the load and a supply voltage in the first state;
wherein the capacitance is configured to receive charge during a second state of the circuit; and
wherein the capacitor is isolated from the current source during the second state.

18. The circuit of claim 17, wherein an operating voltage of the load received via the bias current during the first state is higher than a supply voltage of the circuit.

19. The circuit of claim 17, wherein a voltage at a node coupling the capacitance with the current source is configured to trend toward the supply voltage as the bias current depletes charge on the level-shift capacitance during the first state.

20. The circuit of claim 17, wherein the load is an input stage of a differential amplifier.

* * * * *